(12) United States Patent
Ng et al.

(10) Patent No.: US 10,770,399 B2
(45) Date of Patent: Sep. 8, 2020

(54) SEMICONDUCTOR PACKAGE HAVING A FILLED CONDUCTIVE CAVITY

(71) Applicant: Infineon Technologies AG, Neubiberg (DE)

(72) Inventors: Chee Yang Ng, Johor (MY); Hock Siang Chua, Johor (MY); Stefan Macheiner, Kissing (DE); Josef Maerz, Oberhaching (DE); Nurfarena Othman, Melaka (MY); Joseph Victor Soosai Prakasam, Malacca (MY); Hong Hock Tay, Muar (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/274,991

(22) Filed: Feb. 13, 2019

(65) Prior Publication Data
US 2020/0258842 A1 Aug. 13, 2020

(51) Int. Cl.
*H01L 23/538* (2006.01)
*H01L 23/00* (2006.01)
(Continued)

(52) U.S. Cl.
CPC ........ *H01L 23/5386* (2013.01); *H01L 21/486* (2013.01); *H01L 21/4867* (2013.01);
(Continued)

(58) Field of Classification Search
CPC ............. H01L 23/5386; H01L 23/3675; H01L 23/3121; H01L 23/3736; H01L 23/13; H01L 23/49866; H01L 24/16; H01L 21/4867; H01L 24/81; H01L 25/16; H01L 23/5384; H01L 21/486; H01L 2224/81815; H01L 2224/48228; H01L 2224/32145; H01L 2224/16227; H01L 2224/73265; H01L 24/73; H01L 2924/1431; H01L 2224/73253; H01L 2224/48096;
(Continued)

(56) References Cited

U.S. PATENT DOCUMENTS 10,510,713 B1 * 12/2019 Chen ................... H01L 25/0657
2009/0115050 A1 * 5/2009 Kasuya ............... H01L 23/3677
257/701
(Continued)

*Primary Examiner* — Karen Kusumakar
(74) *Attorney, Agent, or Firm* — Murphy, Bilak & Homiller, PLLC

(57) ABSTRACT

A semiconductor package includes a frame having an insulative body with a first main surface and a second main surface opposite the first main surface, a first plurality of metal traces at the first main surface, and a first cavity in the insulative body. A thermally and/or electrically conductive material filling the first cavity in the insulative body and having a different composition than the first plurality of metal traces. The thermally and/or electrically conductive material provides a thermally and/or electrically conductive path between the first and the second main surfaces of the insulative body. A semiconductor die attached to the frame at the first main surface of the insulative body is electrically connected to the first plurality of metal traces and to the thermally and/or electrically conductive material filling the first cavity in the insulative body. A corresponding method of manufacture is also described.

17 Claims, 7 Drawing Sheets

(51) Int. Cl.
    *H01L 25/16*      (2006.01)
    *H01L 23/498*      (2006.01)
    *H01L 23/373*      (2006.01)
    *H01L 23/31*      (2006.01)
    *H01L 21/48*      (2006.01)
    *H01L 23/367*      (2006.01)
    *H01L 23/13*      (2006.01)
    *H01L 21/56*      (2006.01)

(52) U.S. Cl.
    CPC .......... *H01L 23/13* (2013.01); *H01L 23/3121* (2013.01); *H01L 23/3675* (2013.01); *H01L 23/3736* (2013.01); *H01L 23/49866* (2013.01); *H01L 23/5384* (2013.01); *H01L 24/16* (2013.01); *H01L 24/81* (2013.01); *H01L 25/16* (2013.01); *H01L 21/56* (2013.01); *H01L 24/32* (2013.01); *H01L 24/48* (2013.01); *H01L 24/73* (2013.01); *H01L 2224/16227* (2013.01); *H01L 2224/16235* (2013.01); *H01L 2224/32145* (2013.01); *H01L 2224/48096* (2013.01); *H01L 2224/48106* (2013.01); *H01L 2224/48228* (2013.01); *H01L 2224/73253* (2013.01); *H01L 2224/73265* (2013.01); *H01L 2224/81815* (2013.01); *H01L 2924/1431* (2013.01)

(58) Field of Classification Search
    CPC ........... H01L 2224/16235; H01L 24/32; H01L 24/48; H01L 21/56; H01L 2224/48106
    See application file for complete search history.

(56) References Cited

U.S. PATENT DOCUMENTS

| | | | |
|---|---|---|---|
| 2014/0132365 A1* | 5/2014 | Nakamura | ......... H01L 23/3735 333/133 |
| 2015/0270192 A1* | 9/2015 | Bar | ...... H01L 23/367 257/706 |

* cited by examiner

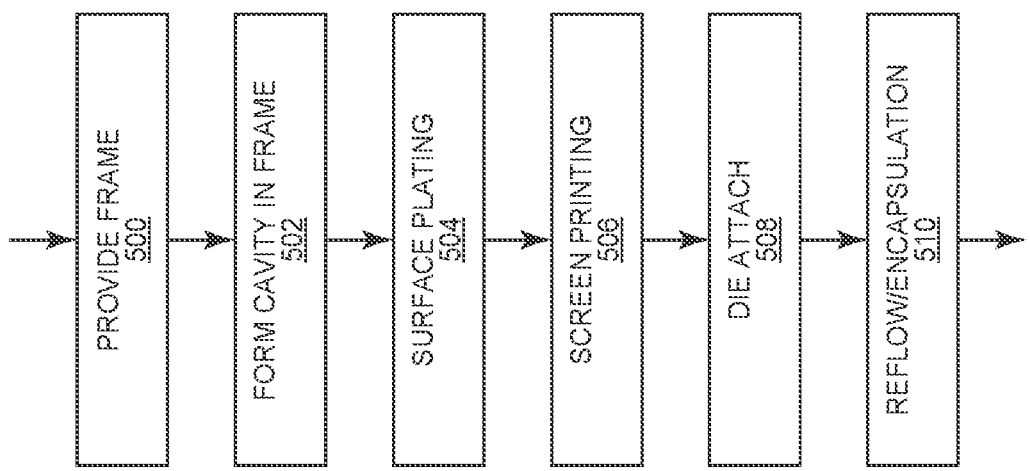

SEMICONDUCTOR PACKAGE HAVING A FILLED CONDUCTIVE CAVITY

BACKGROUND

Conventional leadframe packages provide good heat dissipation due to the use of a thick copper base. However, redistribution of electrical signals in conventional leadframe packages is limited by wire bond constraints. Conventional RDL (redistribution layer) packages such as laminate-based packages provide better flexibility for electrical signal redistribution as compared to conventional leadframe packages. However, conventional RDL packages typically have thinner copper traces which are fabricated by etching of thin Cu sheets or by Cu plating. The use of thin copper traces in conventional RDL packages limits the heat dissipation and power (high current) capability of such packages. This limitation is more severe for system-on-chip (SoC) products/chips where higher pin count and electrical signal redistribution are important considerations, while at the same time an adequate level of power and heat management must be provided.

Thus, there is a need for improved power semiconductor packages with good redistribution of electrical signals and good power and heat management.

SUMMARY

According to an embodiment of a semiconductor package, the semiconductor package comprises: a frame comprising an insulative body having a first main surface and a second main surface opposite the first main surface, a first plurality of metal traces at the first main surface, and a first cavity in the insulative body; a thermally and/or electrically conductive material filling the first cavity in the insulative body and having a different composition than the first plurality of metal traces, the thermally and/or electrically conductive material providing a thermally and/or electrically conductive path between the first and the second main surfaces of the insulative body; and a semiconductor die attached to the frame at the first main surface of the insulative body and electrically connected to the first plurality of metal traces and to the thermally and/or electrically conductive material filling the first cavity in the insulative body.

The semiconductor die may be a power semiconductor die and a high-power terminal of the power semiconductor die facing the first main surface of the insulative body may be electrically connected to the thermally and/or electrically conductive material filling the first cavity in the insulative body.

Separately or in combination, the frame may further comprise a second plurality of metal traces at the second main surface of the insulative body and a plurality of vias electrically connecting the first plurality of metal traces at the first main surface of the insulative body to the second plurality of metal traces at the second main surface of the insulative body, and the high-power terminal of the power semiconductor die may be electrically connected to a metal trace at the second main surface of the insulative body through the thermally and/or electrically conductive material filling the first cavity in the insulative body.

Separately or in combination, the thermally and/or electrically conductive material filling the first cavity may have an area which is at least 10× the average area of the individual vias.

Separately or in combination, the frame may further comprise a second cavity in the insulative body, the second cavity may be smaller than and laterally spaced apart from the first cavity, the second cavity may be filled with a thermally and/or electrically conductive material having a different composition than the first plurality of metal traces and provide a thermally and/or electrically conductive path between the first and the second main surfaces of the insulative body, and a second high-power terminal of the power semiconductor die facing the first main surface of the insulative body may be electrically connected to the thermally and/or electrically conductive material filling the second cavity in the insulative body.

Separately or in combination, the power semiconductor die may comprise a plurality of low power terminals electrically connected to the second plurality of metal traces at the second main surface of the insulative body through the plurality of vias and the first plurality of metal traces.

Separately or in combination, the semiconductor package may further comprise a logic die attached to a side of the power semiconductor die facing away from the frame or to the frame at the first main surface of the insulative body, and the logic die may be configured to control the power semiconductor die.

Separately or in combination, the semiconductor package may further comprise an encapsulant encapsulating the semiconductor die at the first main surface of the insulative body.

Separately or in combination, the frame may be a printed circuit board and the encapsulant may be a mold compound.

Separately or in combination, the thermally and/or electrically conductive material filling the first cavity may comprise a hardened silver paste, a hardened copper paste, a nanocarbon material, or a hardened solder paste, and the first plurality of metal traces may comprise electroplated copper.

Separately or in combination, the thermally and/or electrically conductive material filling the first cavity may not be covered by a metal trace at the first main surface of the insulative body and the semiconductor die may be attached to the thermally and/or electrically conductive material at the first main surface of the insulative body.

Separately or in combination, the first cavity may terminate at a metal trace at the second main surface of the insulative body and the semiconductor die may be electrically connected to the metal trace that terminates the first cavity at the second main surface of the insulative body through the thermally and/or electrically conductive material filling the first cavity.

Separately or in combination, the first cavity may terminate at a metal trace at the first main surface of the insulative body, the semiconductor die may be attached to the metal trace that terminates the first cavity at the first main surface of the insulative body, and the semiconductor die may be electrically connected to the thermally and/or electrically conductive material filling the first cavity through the metal trace that terminates the first cavity at the first main surface of the insulative body.

Separately or in combination, the thermally and/or electrically conductive material filling the first cavity may not be covered by a metal trace at the second main surface of the insulative body.

Separately or in combination, the semiconductor die may be encapsulated in a mold compound at the first main surface of the insulative body and the metal trace that terminates the first cavity at the first main surface of the insulative body may separate the mold compound from the thermally and/or electrically conductive material filling the first cavity.

Separately or in combination, the frame may further comprise a second cavity in the insulative body, the second cavity may be smaller than and laterally spaced apart from the first cavity, the second cavity may be filled with a thermally and/or electrically conductive material having a different composition than the first plurality of metal traces and provide a thermally and/or electrically conductive path between the first and the second main surfaces of the insulative body, and the semiconductor die may be electrically connected to the thermally and/or electrically conductive material filling the second cavity in the insulative body.

Separately or in combination, the thermally and/or electrically conductive material filling the second cavity may have the same composition as the thermally and/or electrically conductive material filling the first cavity.

Separately or in combination, the thermally and/or electrically conductive material filling the first cavity may comprise a hardened silver paste, a hardened copper paste, a nanocarbon material, or a hardened solder paste, the first plurality of metal traces may comprise electroplated copper, and the thermally and/or electrically conductive material filling the second cavity may comprise a hardened silver paste, a hardened copper paste, a nanocarbon material, or a hardened solder paste.

According to an embodiment of a method of manufacturing a semiconductor package, the method comprises: forming a cavity in an insulative body of a frame, the insulative body having a first main surface and a second main surface opposite the first main surface, and a first plurality of metal traces at the first main surface of the insulative body; filling the first cavity in the insulative body with a thermally and/or electrically conductive material having a different composition than the first plurality of metal traces, the thermally and/or electrically conductive material providing a thermally and/or electrically conductive path between the first and the second main surfaces of the insulative body; and attaching a semiconductor die to the frame at the first main surface of the insulative body so that the semiconductor die is electrically connected to the first plurality of metal traces and to the thermally and/or electrically conductive material filling the first cavity in the insulative body.

Filling the first cavity in the insulative body with the thermally and/or electrically conductive material may comprise screen printing an electrically conductive paste in the first cavity and on interconnect pads formed in the plurality of metal traces at the first main surface of the insulative body.

Separately or in combination, the electrically conductive paste may be a sintering silver paste, a sintering copper paste, or a sintering solder paste, and the first plurality of metal traces may be formed by electrochemical deposition prior to the screen printing of the electrically conductive paste.

Separately or in combination, attaching the semiconductor die to the frame at the first main surface of the insulative body may comprise flip-chip bonding a high-power terminal of the semiconductor die to the thermally and/or electrically conductive material filling the first cavity in the insulative body and a plurality of low power terminals of the semiconductor die to the interconnect pads at the first main surface of the insulative body.

Separately or in combination, the method may further comprise, after the semiconductor die is attached to the frame, encapsulating the semiconductor die and the first main surface of the insulative body in a mold compound.

According to another embodiment of a semiconductor package, the semiconductor package comprises: a frame comprising an insulative body, first metal traces at a first main surface of the insulative body, second metal traces a second main surface of the insulative body opposite the first main surface, vias extending electrically connecting some or all of the first metal traces at the first main surface to some or all of the second metal traces at the second main surface, and a cavity formed in a region of the insulative body devoid of electrically conductive vias; a hardened silver paste, a hardened copper paste, a nanocarbon material, or a hardened solder paste filling the cavity in the insulative body; and a semiconductor die attached to the frame at the first main surface of the insulative body and electrically connected to some or all of the first metal traces and to the hardened silver paste, hardened copper paste, nanocarbon material, or hardened solder paste filling the cavity in the insulative body.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 5 illustrates a flow diagram of an embodiment of a method of manufacturing the semiconductor packages shown in FIGS. 1 through 4.

DETAILED DESCRIPTION

The embodiments described herein provide a semiconductor package including a frame to which one or more semiconductor dies are attached, and corresponding methods of manufacturing the semiconductor package. The frame has a cavity that is devoid of electrically conductive vias and filled with a hardened silver paste, a hardened copper paste, a nanocarbon material, a hardened solder paste, or similar type of thermally and/or electrically conductive material that is different from the electroplated metal parts of the frame. The thermally and/or electrically conductive material filling the cavity in the frame provides a thermally and/or electrically conductive path between opposing main surfaces of the frame. The frame may have a single cavity or more than one cavity filled with a thermally and/or electrically conductive material for providing at least one thermally and/or electrically conductive path between opposing main surfaces of the frame.

Figure 1:
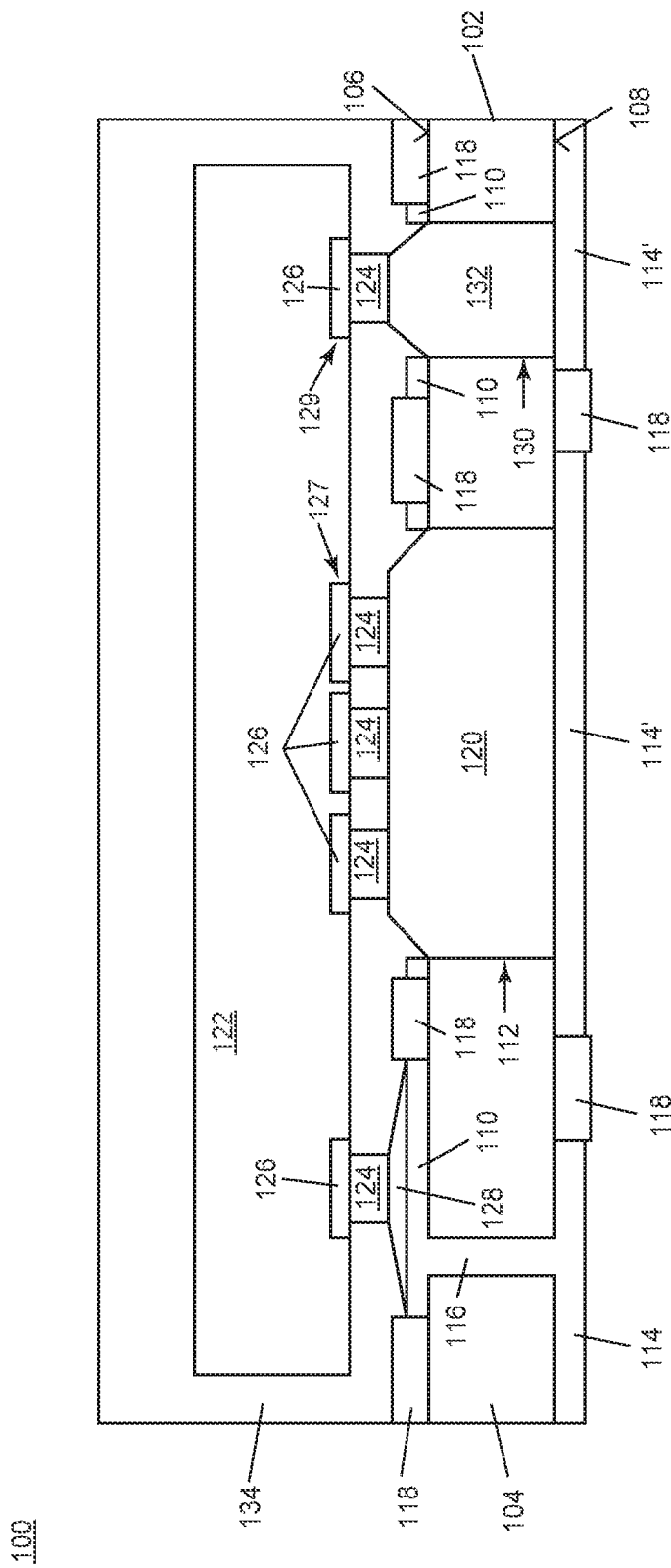
FIG. 1 illustrates a partial sectional view of an embodiment of a semiconductor package including a frame with a filled cavity devoid of electrically conductive vias.

FIG. 1 illustrates a partial sectional view of an embodiment of a semiconductor package 100. The semiconductor package 100 includes a frame 102 comprising an insulative body 104 having a first main surface 106 and a second main surface 108 opposite the first main surface 106, first metal traces 110 at the first main surface 106, and a first cavity 112 formed in the insulative body 104. In one embodiment, the frame 102 is a circuit board such as a printed circuit board (PCB). In the case of a PCB frame, the PCB may be single-sided (e.g. one copper layer), double-sided (e.g. two copper layers on both sides of the insulative body), or multi-layer (e.g. outer and inner layers of copper, alternating with layers of insulating material). In another embodiment, the frame 102 is a plastic molded body. Still other frames with a cavity formed therein may be used.

The frame 102 may further include second metal traces 114 at the second main surface 108 of the insulative body 104 and vias 116 electrically connecting some or all of the first metal traces 110 at the first main surface 106 of the insulative body 104 to some or all of the second metal traces 114 at the second main surface 108 of the insulative body 104. The metal traces 110, 114 at each main surface 106, 108 of the insulative body 104 are separated from one another by an insulating material 118, e.g., such as a photoresist mask used during electroplating of the traces 110, 114 and vias 116 in the case of a PCB frame. The cavity 112 is formed in a region of the insulative body 104 devoid of electrically conductive vias. The term "via" as used herein means a small opening or hole in an insulating material that allows a conductive connection between different layers. That is, vias are mechanical structures which allow electrical interconnections between dedicated layers of the frame 102.

The frame 102 may have two layers of metal traces 110, 114 as shown in FIG. 1 or more than two layers of metal traces. In either case, the vias 116 electrically connect some or all of the first metal traces 110 at the first main surface 106 of the insulative body 104 to some or all of the second metal traces 114 at the second main surface 108 of the insulative body 104. In the case of the frame 102 having more than two layers of metal traces 110, 114, the vias 116 would be provided in more than one insulating layer 118 of the frame 102.

The via-free cavity 112 formed in the insulative body 104 of the frame 102 is filled with a thermally and/or electrically conductive material 120. The thermally and/or electrically conductive material 120 filling the cavity 112 has a different composition than the metal traces 110, 114 and the electrically conductive vias 116. That is, the thermally and/or electrically conductive material 120 filling the cavity 112 may comprise a different material than the metal traces 110, 114 and the electrically conductive vias 116 (e.g. hardened silver paste for the material 120 filling the cavity 112 and Cu for the metal traces 110, 114 and vias 116) or the thermally and/or electrically conductive material 120 filling the cavity 112 may comprise the same type of material as the metal traces 110, 114 and vias 116 but with one or more structural and/or chemical differences such as purity level, concentration levels of constituent parts, etc. (e.g. hardened Cu paste with a Cu purity level less than 99.99% for the material 120 filling the cavity 112 and at least 99.99% pure Cu for the metal traces 110, 114 and vias 116). Because the thermally and/or electrically conductive material 120 filling the cavity 112 is formed at a different time and/or by a different process than the metal traces 110, 114 and vias 116, the material 120 filling the cavity 112 does not have the identical composition as the metal traces 110, 114 and vias 116—even if they contain the same type of material (e.g. Cu). In the case of a PCB, the metal traces 110, 114 may be patterned into one or more copper sheet layers laminated onto and/or between layers of the insulative body 104. The electrically conductive vias 116 may be plated through holes formed in the insulative body 104. In one embodiment, the metal traces 110, 114 and electrically conductive vias 116 comprise electroplated copper formed by electrochemical deposition (ECD).

The metal traces 110, 114 may be patterned into conductive tracks for signal redistribution at one or both main surfaces 106, 108 of the insulative body 104, and/or patterned into conductive pads for attaching one or more semiconductor dies 122 to the frame 102 of the semiconductor package 100 and/or attaching the semiconductor package 100 to another semiconductor package or to a circuit board. For example, one or more semiconductor dies 122 may be attached to the frame 102 at the first main surface 106 of the insulative body 104 and electrically connected to the first metal traces 110 and to the thermally and/or electrically conductive material 120 filling the cavity 112 formed in the insulative body 104. The semiconductor package 100 may be attached to another semiconductor package or to a circuit board (not shown) at the second main surface 108 of the insulative body 104.

A die interconnect 124 such as wire stud bumps, metal pillars, vertical bond wires, etc. may be used to attach die pads 126 on each semiconductor die 122 to corresponding pads patterned into the first metal traces 110. A die attach material 128 may be used to join the die interconnect 124 to the pads patterned into the first metal traces 110. The die attach material 128 may have the same or different composition as the thermally and/or electrically conductive material 120 filling the cavity 112 formed in the insulative body 104 of the frame 102. For example, the die attach material 128 and the thermally and/or electrically conductive material 120 filling the cavity 112 may be formed using a common deposition process such as screen printing.

In one embodiment, the thermally and/or electrically conductive material 120 filling the cavity 112 formed in the insulative body 104 comprises a hardened silver paste. In another embodiment, the thermally and/or electrically conductive material 120 filling the cavity 112 formed in the insulative body 104 comprises a hardened copper paste. In another embodiment, the thermally and/or electrically conductive material 120 filling the cavity 112 formed in the insulative body 104 comprises a nanocarbon material. In another embodiment, the thermally and/or electrically conductive material 120 filling the cavity 112 formed in the insulative body 104 comprises a hardened solder paste such as SAC305 which is a lead-free alloy containing 96.5% tin, 3% silver and 0.5% copper. Still other types of thermally and/or electrically conductive material may fill the cavity 112 formed in the insulative body 104.

In each case, the cavity 112 is formed in a region of the insulative body 104 devoid of electrically conductive vias and the thermally and/or electrically conductive material 120 filling the cavity 112 has a different composition (e.g. hardened silver paste, hardened copper paste, a nanocarbon material, or hardened solder paste) than the metal traces 110, 114 and electrically conductive vias 116 (e.g. electroplated copper) of the frame 102. This way, the thermally and/or electrically conductive path provided by the thermally and/ or electrically conductive material 120 filling the cavity 112 in the insulative body 104 is not constrained by via design rules or via processing limitations and tolerances. For example, a typical PCB thermal via may have an area of about 0.5 mm² and a minimum via-to-via spacing of about 40 μm. Such dimensions limit the number of vias which may be placed under a thermal hotspot or any region of a semiconductor die where the die temperature tends to be hotter, impacting thermal performance of the package. For example, in the case of a power semiconductor die, a severe electrical transient may generate a thermal hotspot which could reach a point of uncontrolled turn on. Permanent damage may result if the temperature continues to increase.

By omitting thermal vias below one or more thermal hotspots of a semiconductor die in favour of the filled cavity described herein, the overall size of the frame 102 may be reduced and/or the thermal resistance of the thermally and/or electrically conductive path provided by the thermally and/or electrically conductive material 120 filling the cavity 112 in the insulative body 104 of the frame 102 may be lower as compared to using vias, reducing the overall package cost and/or improving the thermal performance of the package 100. In one embodiment, the thermally and/or electrically conductive material 120 filling the 112 cavity in the insulative body 104 has an area which is at least 10×, e.g. at least 100×, e.g. at least 200×, e.g. at least 300×, e.g. at least 400×, e.g. at least 500× the average area of the individual vias 116 outside the region of the cavity 112.

The thermally and/or electrically conductive material 120 filling the cavity 112 in the insulative body 104 of the frame 102 may also have a thickness less than the minimum thickness which can be realized by rolling/stamping a Cu block from a Cu sheet. Such a Cu block has a typical minimum thickness of about 125 μm, whereas the thermally and/or electrically conductive material 120 filling the cavity 112 in the insulative body 104 may have a thickness of less than 100 μm or even less than 80 μm, further lowering the thermal resistance of the thermally and/or electrically conductive path provided by the thermally and/or electrically conductive material 120 filling the cavity 112 as compared to using a Cu block.

In one embodiment, at least one semiconductor die 122 included in the semiconductor package 100 is a power semiconductor die such as a power MOSFET (metal-oxide-semiconductor field effect transistor) die, IGBT (insulated gate bipolar transistor) die, HEMT (high-electron mobility transistor) die, power diode die, etc. A high-power terminal 127 such as a drain, collector or cathode terminal of the power semiconductor die 122 facing the first main surface 106 of the insulative body 104 is electrically connected to the thermally and/or electrically conductive material 120 filling the cavity 112 in the insulative body 104. The high-power terminal 127 of the power semiconductor die 122 is electrically connected to a metal trace 114' at the second main surface 108 of the insulative body 104 through the thermally and/or electrically conductive material 120 filling the cavity 112 in the insulative body 104 instead of through a plurality of vias or a Cu block, according to this embodiment. The semiconductor package 100 may include a single semiconductor die 122 or more than one die 122. One semiconductor die 122 is shown in FIG. 1 for ease of illustration only.

At least one semiconductor die 122 attached to the frame 102 of the package 100 may have more than one thermal hotspot or more than one region where the die temperature tends to be hotter. In one embodiment, the frame 102 further includes at least a second cavity 130 formed in the insulative body 104. The second cavity 130 is laterally spaced apart from the first cavity 112 and may be smaller than the first cavity 112. The second cavity 130 also is filled with an thermally and/or electrically conductive material 132 having a different composition than the metal traces 110, 114 and vias 116 of the frame 102, and provides an additional thermally and/or electrically conductive path between the first and second main surfaces 106, 108 of the insulative body 104. In the case of a power semiconductor die 122, a second high-power terminal 129 of the power semiconductor die 122 facing the first main surface 106 of the insulative body 104 may be electrically connected to the thermally and/or electrically conductive material 132 filling the second cavity 130 formed in the insulative body 104. The second high-power terminal 129 of the power semiconductor die 122 is electrically connected to a metal trace 114" at the second main surface 108 of the insulative body 104 through the thermally and/or electrically conductive material 132 filling the second cavity 130 in the insulative body 104 instead of through a plurality of vias or a Cu block, according to this embodiment.

The thermally and/or electrically conductive material 132 filling the second cavity 130 formed in the insulative body 104 may or may not have the same composition as the thermally and/or electrically conductive material 120 filling the first cavity 112 formed in the insulative body 104. In one embodiment, the thermally and/or electrically conductive material filling 120 the first cavity 112 comprises a hardened silver paste, a hardened copper paste, a nanocarbon material, or a hardened solder paste, the thermally and/or electrically conductive material 132 filling the second cavity 130 comprises a hardened silver paste, a hardened copper paste, a nanocarbon material, or a hardened solder paste, and the metal traces 110, 114 and electrically conductive vias 116 of the frame 102 comprise electroplated copper. For example, the thermally and/or electrically conductive material 120 filling the first cavity 112 formed in the insulative body 104 and the thermally and/or electrically conductive material 132 filling the second cavity 130 formed in the insulative body 104 may be formed using a common deposition process such as screen printing, whereas the metal traces 110, 114 and electrically conductive vias 116 of the frame 102 may be formed by an electroplating process such as ECD.

Continuing with the example of a power semiconductor die, the power semiconductor die 122 may also have low power terminals such as I/O (input/output) terminals, sense terminals such as voltage, current and/or temperature sense terminals, etc. electrically connected to the metal traces 114 at the second main surface 108 of the insulative body 104 through the vias 116 and through the metal traces 110 at the first main surface 106 of the insulative body 104.

The semiconductor package 100 may also include an encapsulant 134 which encapsulates each semiconductor die 122 at the first main surface 106 of the insulative body 104. In one embodiment, the frame 102 is a PCB and the encapsulant 134 is a mold compound.

According to the embodiment illustrated in FIG. 1, the thermally and/or electrically conductive material 120, 132 filling each cavity 112, 130 formed in the insulative body 104 of the frame 102 is not covered by a metal trace at the first main surface 106 of the insulative body 104. As such, the semiconductor die 122 shown in FIG. 1 is attached to the thermally and/or electrically conductive material 120, 132 filling each cavity 112, 130 at the first main surface 106 of the insulative body 104 by the die interconnect 124 without an intervening metal trace. Further according to this embodiment, each cavity 112, 130 terminates at a metal trace 114', 114" at the second main surface 108 of the insulative body 104. The semiconductor die 122 is electrically connected to the metal trace 114 that terminates the corresponding cavity 112, 130 at the second main surface 108 of the insulative body 104 through the thermally and/or electrically conductive material 120, 132 which fills that cavity 112, 130. The metal traces 114 that terminate each cavity 112, 130 at the second main surface 108 of the insulative body 104 may be patterned as pads for attachment to another semiconductor package or to a circuit board such as a PCB (not shown), and are relatively thin compared to the thermally and/or electrically conductive material 120, 132 which fills each cavity 112, 130. In one embodiment, the metal traces 114 that terminate each cavity 112, 130 at the second main surface 108 of the insulative body 104 have a thickness of about 15 μm to 20 μm.

Figure 2:
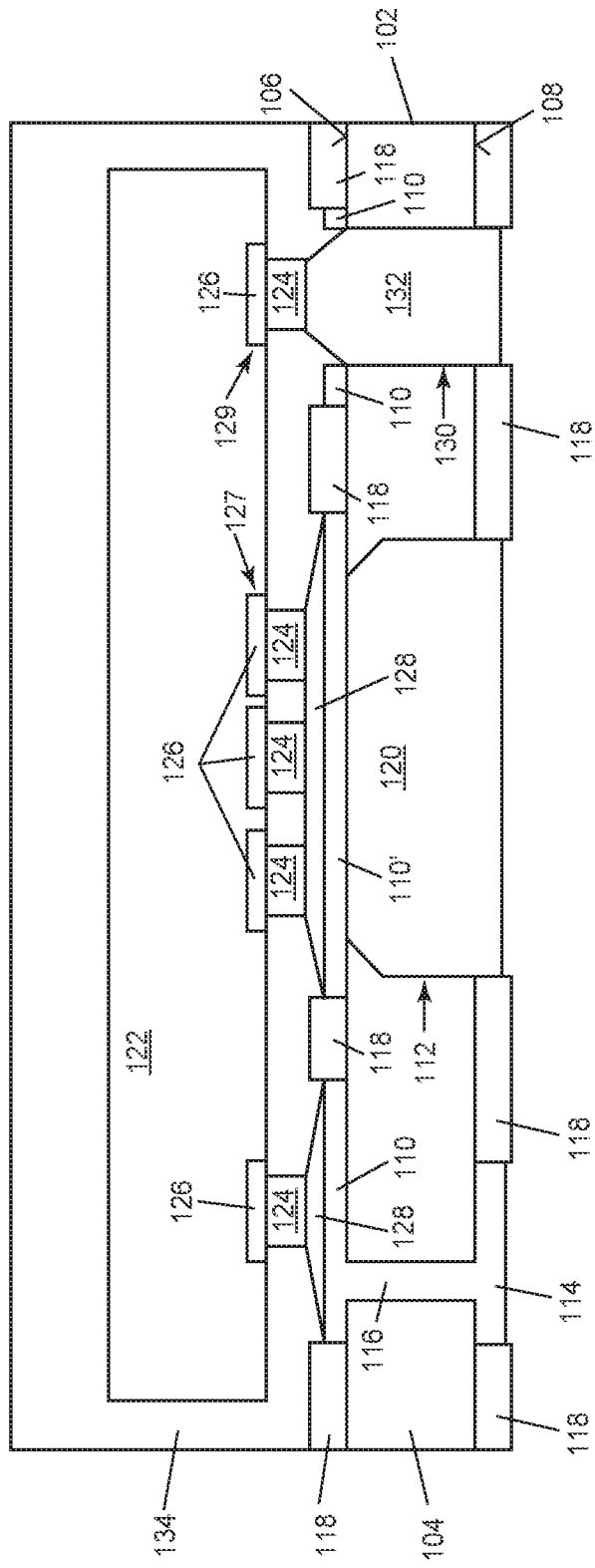
FIG. 2 illustrates a partial sectional view of another embodiment of a semiconductor package including a frame with a filled cavity devoid of electrically conductive vias.

FIG. 2 illustrates a partial sectional view of another embodiment of a semiconductor package 200. The semiconductor package 200 illustrated in FIG. 2 is similar to the semiconductor package 100 illustrated in FIG. 1. Different, however, at least the first cavity 112 formed in the insulative body 104 of the package frame 102 terminates at a metal trace 110' at the first main surface 106 of the insulative body 104 in FIG. 2. The semiconductor die 122 is attached to the metal trace 110' that terminates the first cavity 112 at the first main surface 106 of the insulative body 104, and is electrically connected to the thermally and/or electrically conductive material 120 which fills the first cavity 112 through the metal trace 110' that terminates the cavity 112 at the first main surface 106 of the insulative body 104. The thermally and/or electrically conductive material 120, 132 filling each cavity 112, 130 formed in the insulative body 104 is not covered by a metal trace at the second main surface 108 of the insulative body 104.

The metal trace 110' that terminates the first cavity 112 at the first main surface 106 of the insulative body 104 separates the encapsulant 134 from the thermally and/or electrically conductive material 120 filling the first cavity 112. In the case of a mold compound type encapsulant 134, the possibility of delamination between the mold compound encapsulant 134 and the thermally and/or electrically conductive material 120 filling the first cavity 112 is eliminated by terminating the first cavity 112 at the first main surface 106 of the insulative body 104 with a metal trace 110'. In the case of the cavity filler material being hardened solder paste, the metal trace 110' that terminates the first cavity 112 at the first main surface 106 of the insulative body 104 also mitigates against re-melted solder from contacting the mold compound type encapsulant 134. Other cavities 130 formed in the insulative body 104 of the package frame 102 may also terminate at a metal trace at the first main surface 106 of the insulative body 104.

Figure 3:
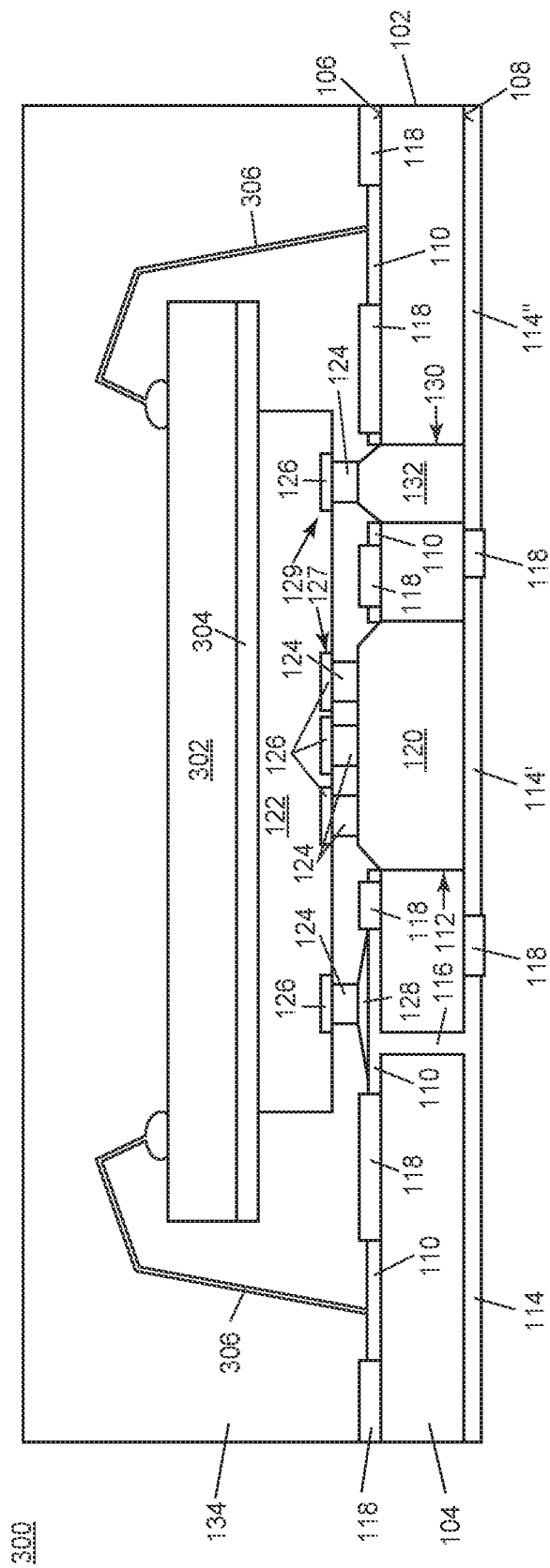
FIG. 3 illustrates a partial sectional view of another embodiment of a semiconductor package including a frame with a filled cavity devoid of electrically conductive vias.

FIG. 3 illustrates a partial sectional view of another embodiment of a semiconductor package 300. The semiconductor package 300 illustrated in FIG. 3 is similar to the semiconductor package 100 illustrated in FIG. 1. Different, however, the semiconductor package 300 in FIG. 3 further includes a logic die 302 attached to a side of the first semiconductor die 122 facing away from the frame 102. In one embodiment, the first semiconductor die 122 is a power transistor die such as a power MOSFTE die, IGBT die, HEMT die, etc. and the logic die 302 includes a controller and/or driver circuitry for controlling the power transistor die 122. The logic die 302 may be attached to the power transistor die 122 by a die attach material 304 such as solder, glue, etc. The logic die 302 may be electrically connected to some of the metal traces 110 at the first main surface 106 of the insulative body 104 by electrical conductors 306 such as bond wires.

Figure 4:
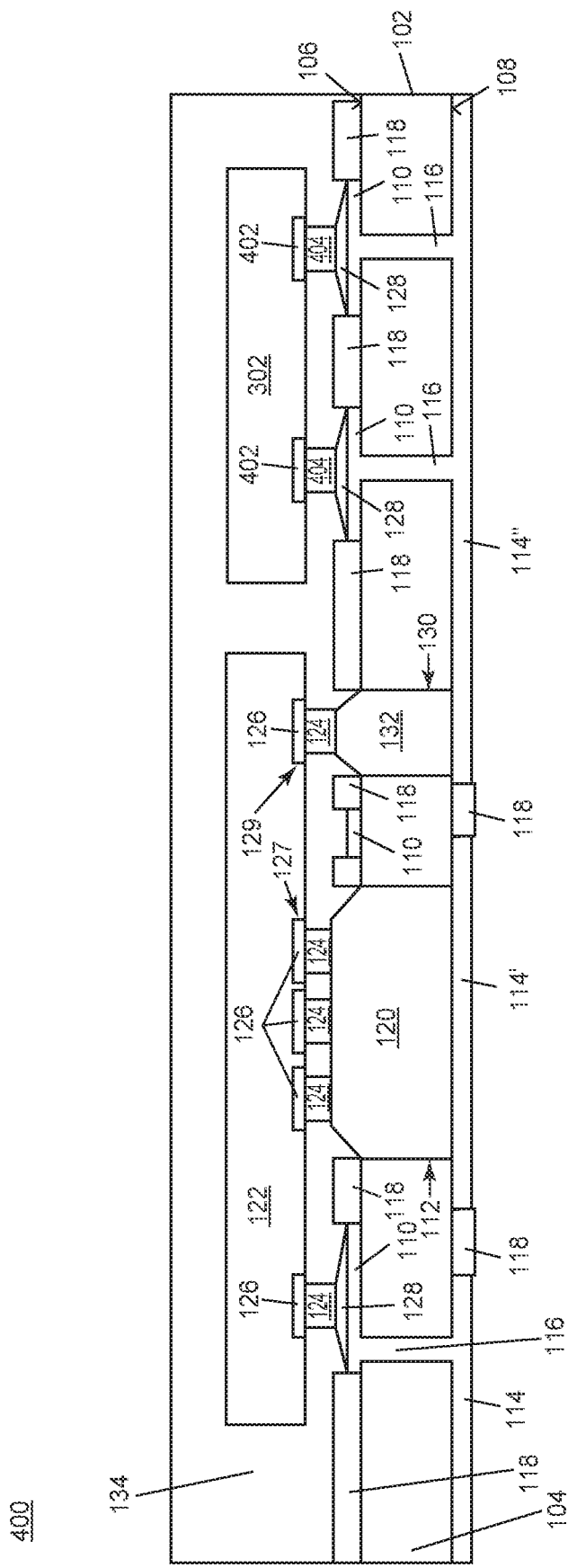
FIG. 4 illustrates a partial sectional view of another embodiment of a semiconductor package including a frame with a filled cavity devoid of electrically conductive vias.

FIG. 4 illustrates a partial sectional view of another embodiment of a semiconductor package 400. The semiconductor package 400 illustrated in FIG. 4 is similar to the semiconductor package 300 illustrated in FIG. 3. Different, however, the logic die is attached to the frame 102 at the first main surface 106 of the insulative body 104 in FIG. 4 instead of to the power transistor die 122. The logic die 302 has pads 402 that are attached to the frame 102 through the same or different interconnect 404 as the power transistor die 122.

FIG. 5 illustrates an embodiment of a method of manufacturing the semiconductor packages 100, 200, 300, 400 described herein. FIGS. 6A through 6D illustrate respective partial sectional views during different stages of the manufacturing process.

The method includes providing a frame such as a circuit board, plastic molded body, etc. (Block 500). One or more cavities are then formed in the frame (Block 502). The one or more cavities may be formed in the frame as part of, e.g., a typical PCB or plastic molding process. Metal traces and electrically conductive vias are then formed. In the case of copper traces and vias, the traces and vias may be electroplated using an ECD surface plating process. With ECD, Cu traces are formed on regions of the main surfaces of the insulative body of the frame not covered by an electroplating mask such as a photoresist and sidewalls of through holes formed in the insulative body are electroplated with Cu.

Figure 6C:
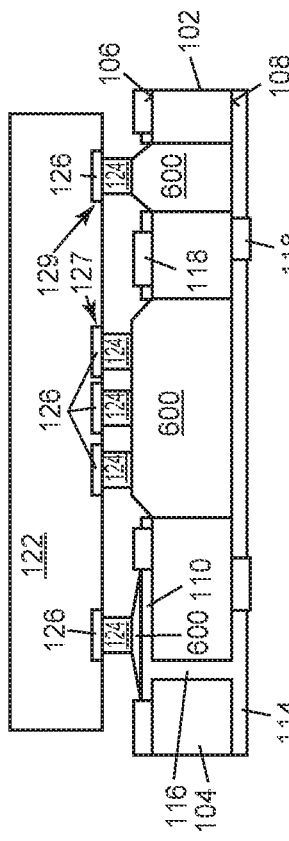
FIGS. 6A through 6D illustrate respective partial sectional views during different stages of the manufacturing method shown in FIG. 5.
Figure 6D:
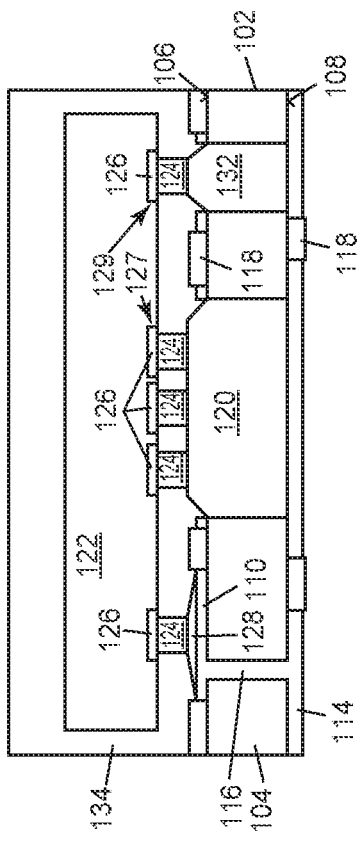
Figure 6A:
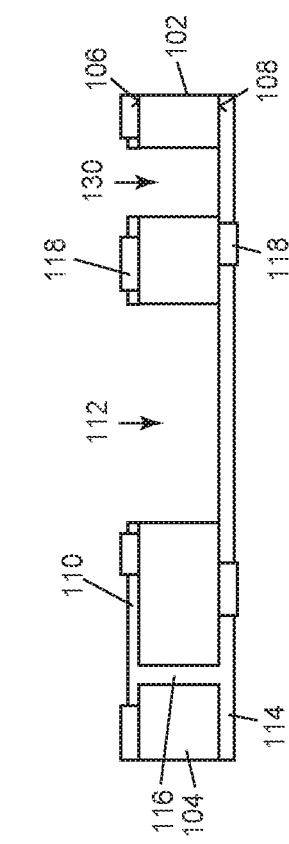

FIG. 6A shows the frame 102 after the one or more cavities 112, 130 are formed in the insulative body 104 and after the metal traces 110, 114 and electrically conductive vias 116 are formed.

Each cavity 112, 130 formed in the insulative body 104 of the frame 102 is then filled with a thermally and/or electrically conductive material 120, 132 having a different composition than the metal traces 110, 114 and electrically conductive vias 116 of the frame 102 (Block 506). In one embodiment, each cavity 112, 130 formed in the insulative body 104 of the frame 102 is filled by screen printing an electrically conductive paste 600 in each cavity 112, 130 and on interconnect pads formed in the metal traces 110 at the first main surface 106 of the insulative body 104. For example, the electrically conductive paste 600 may be a sintering silver paste, a sintering copper paste, or a sintering solder paste and the metal traces 110, 114 and vias 116 may be electroplated copper formed by ECD. Each filled cavity 112, 130 provides a thermally and/or electrically conductive path between the first and second main surfaces 106, 108 of the insulative body 104.

Figure 6B:
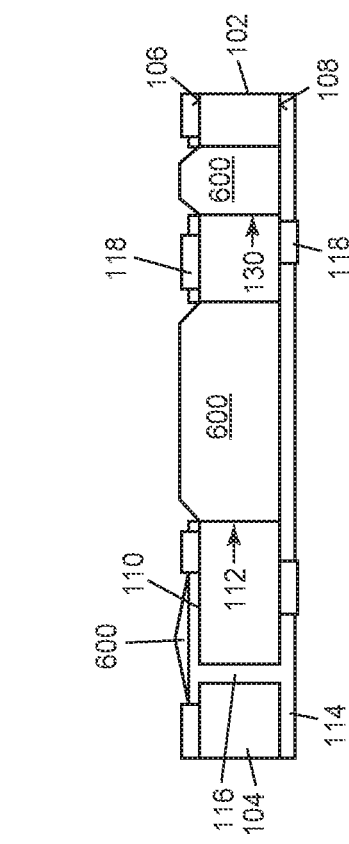

FIG. 6B shows the frame 102 after each cavity 112, 130 formed in the insulative body 104 is filled with the electrically conductive paste 600.

One or more semiconductor dies 122 are then attached to the frame 102 at the first main surface 106 of the insulative body 104 (Block 508). At least one semiconductor die 122 is electrically connected to the metal traces 110 at the first main surface 106 of the insulative body 104 and to the electrically conductive paste 600 in each cavity 112, 130 formed in the insulative body 104. The electrically conductive paste 600 screen printed on the interconnect pads patterned into the metal traces 110 at the first main surface 106 of the insulative body 104 acts as a die attach material which joins the die interconnect 124 to the pads of the frame 102. In one embodiment, at least one semiconductor die 122 is attached to the frame 102 at the first main surface 106 of the insulative body 104 by flip-chip bonding a high-power terminal 127 of the semiconductor die 122 to the electrically conductive paste 600 in the first cavity 112 formed in the insulative body 104 and flip-chip bonding low power terminals of the semiconductor die 122 to the interconnect pads patterned into the metal traces 110 at the first main surface 106 of the insulative body 104.

FIG. 6C shows the frame 102 after each die 122 is attached to the frame 102 at the first main surface 106 of the insulative body 104. Additional dies may be attached to the second main surface 106 of the insulative body 104 and/or to one or more of the dies 122 attached to the first main surface 106 of the insulative body 104, e.g., as shown in FIG. 3.

The semiconductor package is then subjected to a reflow process during which the electrically conductive paste 600 screen printed in each cavity 112, 130 and on the interconnect pads formed in the metal traces 110 at the first main surface 106 of the insulative body 104 is reflowed at elevated temperature (and optionally elevated pressure) and then cooled until hardened to form the die attach material 128 which secures the die interconnect 124 to the frame 102 and the thermally and/or electrically conductive material 120, 132 which fills each cavity 112, 130 formed in the insulative body 104 of the frame 102. Each semiconductor die 122 attached to the frame at the first main surface 106 of the insulative body 104 is then encapsulated in an encapsulant 134 such as a mold compound (Block 510). Additional processing may be performed, such as de-burring, marking, singulation, etc.

FIG. 6D shows the frame 102 after the reflow and encapsulation processes.

Figure 7C:
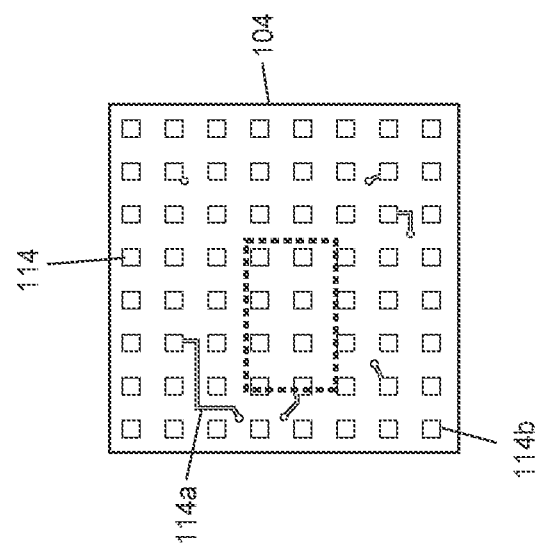
FIGS. 7A through 7C illustrate different layers of a frame included in the semiconductor packages shown in FIGS. 1 through 4.
Figure 7B:
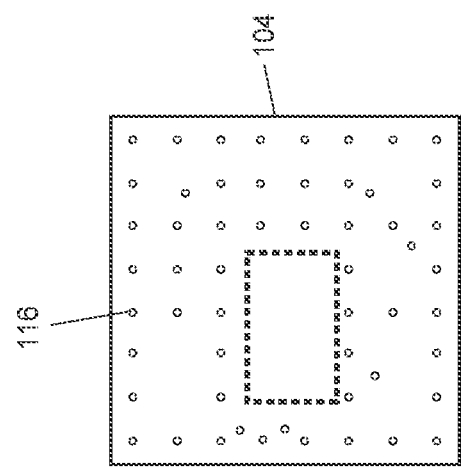
Figure 7A:
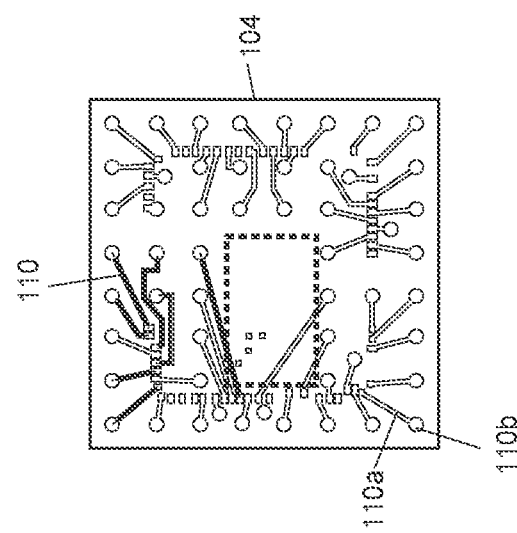

FIGS. 7A through 7C illustrate different layers of the semiconductor package frame 102 described herein. FIG. 7A shows the metal traces 110 at the first main surface 106 of the insulative body 104, FIG. 7C shows the metal traces 114 at the second main surface 108 of the insulative body 104, and FIG. 7B shows the vias 116 which electrically connect the metal traces 110, 114 at the opposing main surfaces 106, 108 of the insulative body 104. The metal traces 110, 114 may be patterned into conductive tracks 110a, 114a for signal redistribution at one or both main surfaces 106, 108 of the insulative body 104, and/or patterned into conductive pads 110b, 114b for attaching one or more semiconductor dies to the frame 102 and/or attaching the frame 102 to another semiconductor package or to a circuit board (not shown), as previously described herein.

At least one region of the insulative body 104 is devoid of electrically conductive vias. One such region is illustrated by a dashed box in FIGS. 7A through 7C. As shown in FIG. 7B, which illustrates a via layer of the insulative substrate 104, electrically conductive vias 116 are omitted from at least one region of the insulative substrate 104. Each of these via-free regions is reserved for forming a cavity 112/130 in the insulative body 104. Each cavity 112/130 in the insulative body 104 is subsequently filled with a thermally and/or electrically conductive material 120/132 having a different composition than the metal traces 110, 114 and vias 116 of the frame 102 to provide one or more separate thermally and/or electrically conductive paths between the first and second main surfaces 106, 108 of the insulative body 104, as previously described herein. In FIG. 7C, the separate pads 114b at the second main surface 108 of the insulative body 104 and which reside within the via-free region reserved for a cavity may be joined together to form a single pad.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a frame comprising an insulative body having a first main surface and a second main surface opposite the first main surface, a first plurality of metal traces at the first main surface, and a first cavity in the insulative body;
a thermally and/or electrically conductive material filling the first cavity in the insulative body and having a different composition than the first plurality of metal traces, the thermally and/or electrically conductive material providing a thermally and/or electrically conductive path between the first and the second main surfaces of the insulative body; and
a semiconductor die attached to the frame at the first main surface of the insulative body and electrically connected to the first plurality of metal traces and to the thermally and/or electrically conductive material filling the first cavity in the insulative body,
wherein the semiconductor die is a power semiconductor die,
wherein a high-power terminal of the power semiconductor die facing the first main surface of the insulative body is electrically connected to the thermally and/or electrically conductive material filling the first cavity in the insulative body.

2. The semiconductor package of claim 1, wherein the frame further comprises one or more second metal traces at the second main surface of the insulative body and one or more vias electrically connecting one or more metal traces of the first plurality of metal traces at the first main surface of the insulative body to the one or more second metal traces at the second main surface of the insulative body, and wherein the high-power terminal of the power semiconductor die is electrically connected to a metal trace at the second main surface of the insulative body through the thermally and/or electrically conductive material filling the first cavity in the insulative body.

3. The semiconductor package of claim 2, wherein the thermally and/or electrically conductive material filling the first cavity has an area which is at least 10× the average area of the individual vias.

4. The semiconductor package of claim 1, wherein the frame further comprises a second cavity in the insulative body, wherein the second cavity is smaller than and laterally spaced apart from the first cavity, wherein the second cavity is filled with a thermally and/or electrically conductive material having a different composition than the first plurality of metal traces and providing a thermally and/or electrically conductive path between the first and the second main surfaces of the insulative body, and wherein a second high-power terminal of the power semiconductor die facing the first main surface of the insulative body is electrically connected to the thermally and/or electrically conductive material filling the second cavity in the insulative body.

5. The semiconductor package of claim 1, wherein the power semiconductor die comprises one or more low power terminals electrically connected to one or more second metal traces at the second main surface of the insulative body through one or more vias and one or more of the first plurality of metal traces.

6. The semiconductor package of claim 1, further comprising a logic die attached to a side of the power semiconductor die facing away from the frame or to the frame at the first main surface of the insulative body, wherein the logic die is configured to control the power semiconductor die.

7. The semiconductor package of claim 1, wherein the thermally and/or electrically conductive material filling the first cavity comprises a hardened silver paste, a hardened copper paste, a nanocarbon material, or a hardened solder paste, and wherein the first plurality of metal traces comprise electroplated copper.

8. A method of manufacturing a semiconductor package, the method comprising:
    forming a cavity in an insulative body of a frame, the insulative body having a first main surface and a second main surface opposite the first main surface, and a first plurality of metal traces at the first main surface of the insulative body;
    filling the first cavity in the insulative body with a thermally and/or electrically conductive material having a different composition than the first plurality of metal traces, the electrically conductive material providing a thermally and/or electrically conductive path between the first and the second main surfaces of the insulative body; and
    attaching a semiconductor die to the frame at the first main surface of the insulative body so that the semiconductor die is electrically connected to the first plurality of metal traces and to the thermally and/or electrically conductive material filling the first cavity in the insulative body,
    wherein attaching the semiconductor die to the frame at the first main surface of the insulative body comprises:
        flip-chip bonding a high-power terminal of the semiconductor die to the thermally and/or electrically conductive material filling the first cavity in the insulative body and a plurality of low power terminals of the semiconductor die to interconnect pads formed in the plurality of metal traces at the first main surface of the insulative body.

9. The method of claim 8, wherein filling the first cavity in the insulative body with the thermally and/or electrically conductive material comprises:
    screen printing an electrically conductive paste in the first cavity and on the interconnect pads.

10. The method of claim 9, wherein the electrically conductive paste is a silver paste, a copper paste, or a solder paste, and wherein the first plurality of metal traces is formed by electrochemical deposition prior to the screen printing of the electrically conductive paste.

11. A semiconductor package, comprising:
    a frame comprising an insulative body having a first main surface and a second main surface opposite the first main surface, a first plurality of metal traces at the first main surface, and a first cavity in the insulative body;
    a thermally and/or electrically conductive material filling the first cavity in the insulative body and having a different composition than the first plurality of metal traces, the thermally and/or electrically conductive material providing a thermally and/or electrically conductive path between the first and the second main surfaces of the insulative body; and
    a semiconductor die attached to the frame at the first main surface of the insulative body and electrically connected to the first plurality of metal traces and to the thermally and/or electrically conductive material filling the first cavity in the insulative body,
    wherein the thermally and/or electrically conductive material filling the first cavity is not covered by a metal trace at the first main surface of the insulative body,
    wherein the semiconductor die is attached to the thermally and/or electrically conductive material at the first main surface of the insulative body,
    wherein the first cavity terminates at a metal trace at the second main surface of the insulative body,
    wherein the semiconductor die is electrically connected to the metal trace that terminates the first cavity at the second main surface of the insulative body through the thermally and/or electrically conductive material filling the first cavity.

12. A semiconductor package, comprising:
    a frame comprising an insulative body having a first main surface and a second main surface opposite the first main surface, a first plurality of metal traces at the first main surface, and a first cavity in the insulative body;
    a thermally and/or electrically conductive material filling the first cavity in the insulative body and having a different composition than the first plurality of metal traces, the thermally and/or electrically conductive material providing a thermally and/or electrically conductive path between the first and the second main surfaces of the insulative body; and
    a semiconductor die attached to the frame at the first main surface of the insulative body and electrically connected to the first plurality of metal traces and to the thermally and/or electrically conductive material filling the first cavity in the insulative body,
    wherein the first cavity terminates at a metal trace at the first main surface of the insulative body,
    wherein the semiconductor die is attached to the metal trace that terminates the first cavity at the first main surface of the insulative body,
    wherein the semiconductor die is electrically connected to the thermally and/or electrically conductive material filling the first cavity through the metal trace that terminates the first cavity at the first main surface of the insulative body.

13. The semiconductor package of claim 12, wherein the thermally and/or electrically conductive material filling the first cavity is not covered by a metal trace at the second main surface of the insulative body.

14. The semiconductor package of claim 12, wherein the semiconductor die is encapsulated in a mold compound at the first main surface of the insulative body, and wherein the metal trace that terminates the first cavity at the first main surface of the insulative body separates the mold compound from the thermally and/or electrically conductive material filling the first cavity.

15. A semiconductor package, comprising:
- a frame comprising an insulative body having a first main surface and a second main surface opposite the first main surface, a first plurality of metal traces at the first main surface, and a first cavity in the insulative body;
- a thermally and/or electrically conductive material filling the first cavity in the insulative body and having a different composition than the first plurality of metal traces, the thermally and/or electrically conductive material providing a thermally and/or electrically conductive path between the first and the second main surfaces of the insulative body; and
- a semiconductor die attached to the frame at the first main surface of the insulative body and electrically connected to the first plurality of metal traces and to the thermally and/or electrically conductive material filling the first cavity in the insulative body,
- wherein the frame further comprises a second cavity in the insulative body,
- wherein the second cavity is smaller than and laterally spaced apart from the first cavity,
- wherein the second cavity is filled with a thermally and/or electrically conductive material having a different composition than the first plurality of metal traces and providing a thermally and/or electrically conductive path between the first and the second main surfaces of the insulative body,
- wherein the semiconductor die is electrically connected to the thermally and/or electrically conductive material filling the second cavity in the insulative body.

16. The semiconductor package of claim 15, wherein the thermally and/or electrically conductive material filling the second cavity has the same composition as the thermally and/or electrically conductive material filling the first cavity.

17. The semiconductor package of claim 15, wherein the thermally and/or electrically conductive material filling the first cavity comprises a hardened silver paste, a hardened copper paste, a nanocarbon material, or a hardened solder paste, wherein the first plurality of metal traces comprises electroplated copper, and wherein the thermally and/or electrically conductive material filling the second cavity comprises a hardened silver paste, a hardened copper paste, a nanocarbon material, or a hardened solder paste.

* * * * *